United States Patent
Chen et al.

(10) Patent No.: US 9,867,275 B2
(45) Date of Patent: Jan. 9, 2018

(54) MODULAR POWER SUPPLY AND METHOD FOR MANUFACTURING THE SAME

(71) Applicant: Delta Electronics (Shanghai) Co., Ltd., Shanghai (CN)

(72) Inventors: Shijie Chen, Shanghai (CN); Yan Deng, Shanghai (CN); Zhihui Wei, Shanghai (CN)

(73) Assignee: DELTA ELECTRONICS (SHANGHAI) CO., LTD., Shanghai (CN)

(*) Notice: Subject to any disclaimer, the term of this patent is extended or adjusted under 35 U.S.C. 154(b) by 92 days.

(21) Appl. No.: 15/058,133

(22) Filed: Mar. 1, 2016

(65) Prior Publication Data
US 2017/0034899 A1  Feb. 2, 2017

(30) Foreign Application Priority Data
Jul. 27, 2015  (CN) .......................... 2015 2 0549423

(51) Int. Cl.
| H05K 7/20 | (2006.01) |
| H05K 1/02 | (2006.01) |
| H05K 1/18 | (2006.01) |
| H01F 27/24 | (2006.01) |
| H05K 3/30 | (2006.01) |

(52) U.S. Cl.
CPC ........... *H05K 1/0203* (2013.01); *H01F 27/24* (2013.01); *H05K 1/0204* (2013.01); *H05K 1/181* (2013.01); *H05K 3/30* (2013.01); *H05K 7/209* (2013.01)

(58) Field of Classification Search
None
See application file for complete search history.

(56) References Cited

U.S. PATENT DOCUMENTS

| 6,466,454 B1* | 10/2002 | Jitaru ..................... H01F 27/06 336/200 |
| 6,982,876 B1* | 1/2006 | Young ................. H05K 1/0203 165/185 |
| 8,531,841 B2* | 9/2013 | Lee ........................ H05K 7/209 174/252 |
| 9,209,106 B2* | 12/2015 | Shi ....................... H01L 23/3677 |
| 9,338,877 B2* | 5/2016 | Robert .................. H01L 23/053 |
| 2002/0054480 A1 | 5/2002 | Jitaru ...................... H01F 27/06 361/704 |
| 2004/0100778 A1* | 5/2004 | Vinciarelli ............. H05K 1/141 361/760 |

* cited by examiner

*Primary Examiner* — Courtney Smith
(74) *Attorney, Agent, or Firm* — CKC & Partners Co., Ltd.

(57) ABSTRACT

A modular power supply and a method for manufacturing the same are disclosed. The modular power supply comprises a printed circuit board, power components, and a heat sink. The power components are mounted on the printed circuit board and disposed at a side opposite to the heat sink, a lower surface of the printed circuit board is engaged with an upper surface of the heat sink which is planar, and an insulating layer is disposed between the upper surface of the heat sink and the lower surface of the printed circuit board. A method for manufacturing the modular power supply is also disclosed. The modular power supply has excellent heat dissipation effect, and the production and assembly process thereof is simplified, so that the production efficiency is improved and the quality is guaranteed.

14 Claims, 5 Drawing Sheets

MODULAR POWER SUPPLY AND METHOD FOR MANUFACTURING THE SAME

CROSS-REFERENCE TO RELATED APPLICATIONS

This non-provisional application claims priority under 35 U.S.C. §119(a) on Patent Application No. 201520549423.9 filed in P.R. China on Jul. 27, 2015, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to a modular power supply and a method for manufacturing the same, and particularly to a modular power supply with a heat sink and a method for manufacturing the same.

BACKGROUND

As a common practice for dissipating heat from a modular power supply, a heat sink is combined with the modular power supply, and the heat sink closely contacts some heat-producing elements, so that heat is conducted to the heat sink and then to the outside. In addition, there are certain requirements for insulation and enhanced insulation in the modular power supply.

The designs of heat dissipation and insulation in the prior art have the following drawbacks. Thermal resistance between the power components and the heat sink is large, and the heat dissipation is poor. The heat sink is complicated in structure. It is difficult to deal with the isolation between the modular power supply and the heat sink.

Reference is made to FIG. 1, which illustrates a structural view of a modular power supply in the prior art. An irregular heat sink 300 is engaged with power components 100 which are mounted on a printed circuit board 200, with heat-conducting glue 400 being filled therebetween. The arrows indicate the direction of heat conduction. Heat from a magnetic element in the power components 100 is conducted to a bottom of the heat sink 300 via the heat-conducting glue 400 and then via an insulating layer 500. Heat from a semiconductor device in the power components 100, e.g., a switching device (like an insulated gate bipolar transistor, IGBT) is firstly conducted to a top of its case, and then to the heat sink 300 via the heat-conducting glue 400 and the insulating layer 500. Taking a switching device (e.g., an IGBT) packaged by Power pak so-8 (PPAK-SO8, 5 mm*6 mm) which is produced by Infineon as an example, the prior art at least suffers from one of the following drawbacks.

1. Thermal resistance between hot sources of semiconductor devices in the power components 100 and the top of the case is very large (>15° C./W).

2. Since power components 100 are of different heights, there are many steps in the heat sink 300. As a result, the heat sink 300 is complex in structure, and it is difficult to deal with the isolation between the heat sink 300 and a module. Generally, an insulating layer is required for each platform, and steps are required to overlap with each other. However, requirements regarding insulation probably can not be met in this case.

3. Generally, the number of steps in the heat sink 300 is controlled to 2 or 3. In this case, the power components 100 from which heat can be dissipated directly via the heat sink 300 are limited in number.

4. Due to the tolerance in height of the power components 100, it is required to fill a gap between the heat sink 300 and the power components 100 with the heat-conducting glue 400. Thermal resistance will be increased to a certain extent. For example, heat-conducting glue with a thickness of 0.3 mm has thermal resistance of about 5.5° C./W.

5. Since there is a distance between the heat sink 300 and the printed circuit board 200, heat from the printed circuit board 200 can not be dissipated directly via the heat sink 300.

6. Generally, power components 100 are disposed on both surfaces of the printed circuit board 200. In this case, there is no path for the heat from power components 100 on one of the surface to be dissipated directly to the heat sink 300.

SUMMARY OF THE INVENTION

It is an object of the present invention to overcome defects in the prior art by providing a modular power supply with an excellent heat dissipation structure and a method for manufacturing the same.

To realize the above-mentioned object, the present invention provides a modular power supply comprising a printed circuit board, power components, and a heat sink, characterized in that, the heat sink has an upper surface which is planar, the power components are mounted on the printed circuit board and disposed at a side opposite to the heat sink, a lower surface of the printed circuit board is engaged with the upper surface of the heat sink, with an insulating layer being disposed between the upper surface of the heat sink and a lower surface of the printed circuit board.

In the above modular power supply, the power components comprise a magnetic element, the magnetic element comprises a magnetic core, a lower surface of the magnetic core and the lower surface of the printed circuit board are disposed in a same plane, the lower surface of the magnetic core is engaged with the upper surface of the heat sink, and an insulating layer is disposed between the lower surface of the magnetic core and the upper surface of the heat sink.

In the above modular power supply, the printed circuit board is provided with mounting grooves which ensures that the lower surface of the magnetic core is engaged with the upper surface of the heat sink.

In the above modular power supply, the magnetic element further comprises a winding board, the magnetic core is mounted on the winding board and positioned in the mounting grooves, the lower surface of the magnetic core and the lower surface of the printed circuit board are disposed in the same plane, and the winding board is mounted on the printed circuit board though a support member.

In the above modular power supply, at least one heat-conducting through hole is formed on the printed circuit board at the positions where the support member is connected to the printed circuit board.

In the above modular power supply, the power components comprise a semiconductor device, the semiconductor device comprises a case having a case top and a case bottom, hot sources of the semiconductor device are located at the case bottom, and the case bottom is close to the printed circuit board.

In the above modular power supply, the semiconductor device further comprises a heat dissipating plate which is disposed between the case bottom and the printed circuit board.

In the above modular power supply, a plurality of through holes are formed in the printed circuit board at positions below the semiconductor device.

The above modular power supply further comprises control panel which is connected to the printed circuit board and disposed at a side opposite to the heat sink.

In the above modular power supply, the insulating layer is formed integrally as one unit.

In the above modular power supply, the lower surface of the printed circuit board is planar.

In the above modular power supply, the upper surface of the printed circuit board is planar.

To better realize the above-mentioned object, the present invention further provides a method for manufacturing the above modular power supply, which comprises the following steps:

S100, mounting the power components on the printed circuit board by using a planar carrier as a baffle during assembling to make the lower surface of the magnetic core in the power components and the lower surface of the printed circuit board be in a same plane;

S200, disposing the insulating layer on the lower surface of the printed circuit board or the upper surface of the heat sink, so that the heat from the printed circuit board can be directly conducted to the heat sink;

S300, fixing the printed circuit board to the heat sink to make the lower surface of the printed circuit board be engaged with the upper surface of the heat sink, with the insulating layer being disposed between the upper surface of the heat sink and the lower surface of the printed circuit board, the printed circuit board is not provided with any power component at its surface contacting the heat sink, and the heat from the power components is conducted to the heat sink via the through holes.

In the above method for manufacturing the modular power supply, the power components comprise a magnetic element which comprises a magnetic core and a winding board, and Step S100 further comprises:

S101, connecting the winding board to the printed circuit board;

S102, assembling the magnetic core in the mounting grooves of the printed circuit board by using the planar carrier as a baffle to make the lower surface of the magnetic core and the lower surface of the printed circuit board be in a same plane, making the lower surface of the magnetic core be engaged with the upper surface of the heat sink, and thus minimizing thermal resistance between the magnetic element and the heat sink.

In the above method for manufacturing the modular power supply, the power components comprise a magnetic element which comprises a magnetic core and a winding board, and Step S100 further comprises:

S101, assembling the magnetic core and the winding board into one piece;

S102, assembling the magnetic core in the mounting grooves of the printed circuit board by using the planar carrier as a baffle to make the lower surface of the magnetic core and the lower surface of the printed circuit board be in a same plane, making the lower surface of the magnetic core be engaged with the upper surface of the heat sink, and thus minimizing thermal resistance between the magnetic element and the heat sink;

S103, connecting the winding board to the printed circuit board by using the support member.

In the above method for manufacturing the modular power supply, the power components comprise a magnetic element which comprises a magnetic core and a winding board, and Step S100 further comprises:

S101, assembling a lower portion of the magnetic core to the winding board;

S102, assembling the lower portion of the magnetic core into the mounting grooves of the printed circuit board by using the planar carrier as a baffle to make the lower surface of the magnetic core and the lower surface of the printed circuit board be in a same plane, making the lower surface of the magnetic core be engaged with the upper surface of the heat sink, and thus minimizing thermal resistance between the magnetic element and the heat sink;

S103, connecting the winding board to the printed circuit board;

S104, assembling an upper portion of the magnetic core to the lower portion of the magnetic core.

In the above method for manufacturing the modular power supply, the insulating layer is a ceramic sheet or an insulating sheet which is formed integrally as one unit.

The advantageous technical effects of the present invention are as follow.

The modular power supply has excellent heat dissipation effect, and the production and assembly process thereof is simplified, so that the production efficiency is improved and the quality is guaranteed.

The present invention will be described in details hereinafter by reference to the accompanying drawings and specific embodiments, but the present invention is by no means limited to these drawings and embodiments.

DESCRIPTION OF THE PREFERRED EMBODIMENTS

The structure and operation of a modular power supply according to the present invention will be described in details hereinafter by referring to the accompanying drawings.

Figure 2:
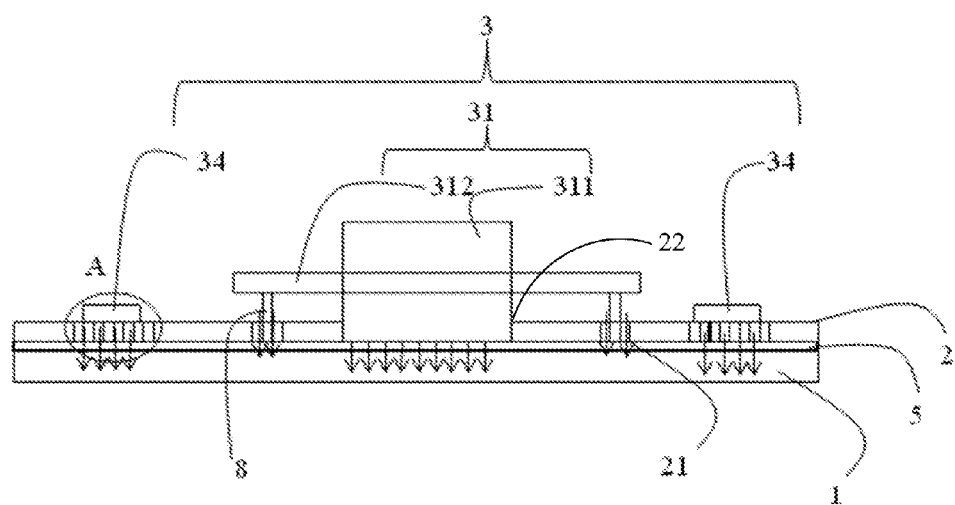
FIG. 2 is a structural view for a modular power supply in an embodiment of the present invention.
Figure 3:
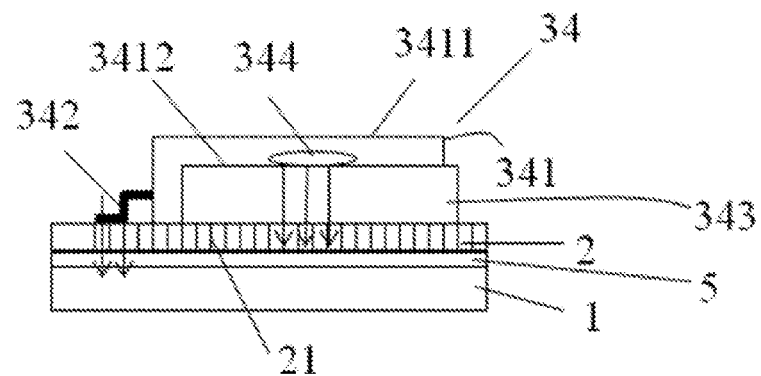
FIG. 3 is an enlarged diagram for a portion A in FIG. 2.

Reference is made to FIG. 2 and FIG. 3. FIG. 2 is a structural view illustrating a modular power supply according to an embodiment of the present invention, and FIG. 3 is an enlarged diagram of a portion A in FIG. 2. The modular power supply of the present invention comprises a printed circuit board 2, power components 3, and a heat sink 1. The power components 3 are mounted on the printed circuit board 2. An upper surface of the heat sink 1 is planar. The heat sink 1 for example can be a rectangular plate. The power components 3 are mounted on the printed circuit board 2 and disposed at a side opposite to the heat sink 1. A lower surface of the printed circuit board 2, which is also planar, is engaged with the upper surface of the heat sink 1, with an insulating layer 5 being disposed between the upper surface of the heat sink 1 and the lower surface of the printed circuit board 2. The insulating layer is formed integrally as one unit and generally has thermally conductive function. In an embodiment of the present invention, an upper surface of the printed circuit board 2 can also be planar.

Figure 1:
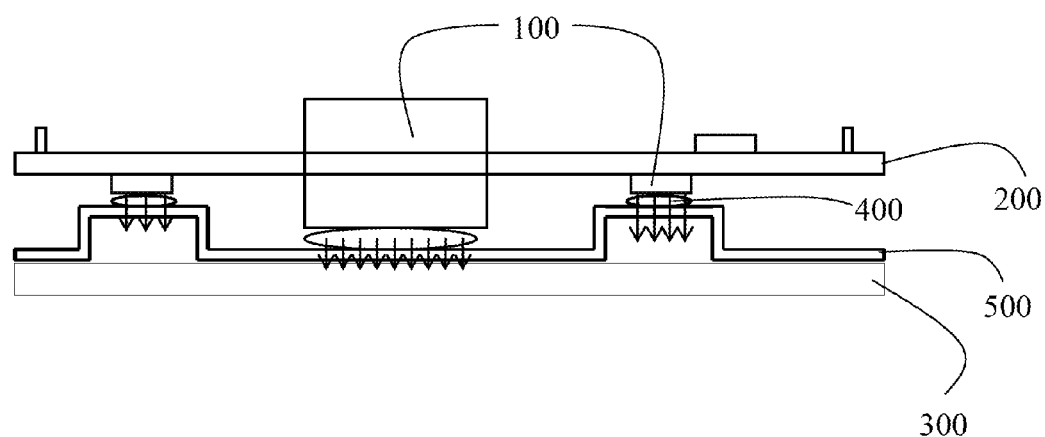
FIG. 1 is a structural view for a modular power supply in the prior art.

In the present invention, since the entire lower surface of the printed circuit board 2 contacts the heat sink, heat from the printed circuit board 2 can be conducted via the heat sink. Meanwhile, many steps exist in the heat sink 300 of the prior art, so that it is required to adhere insulating sheets to different steps and overlap the insulating sheets with each other (FIG. 1). In the present invention, the heat sink has a planar upper surface, so that the structure of the heat sink is simple, making it more convenient to be processed and installed. Due to the planar structure of the heat sink, the isolating process is simplified. The insulating layer 5 can be realized with a single insulating sheet or ceramic sheet capable of dissipating heat, so that not only the safety requirements regarding insulation can be met, but also an enhanced insulation can be provided. Of course, in other embodiments, the insulating layer 5 can also be made of a plurality of insulating sheets or ceramic sheets, and the present invention is not limited in this regard. The present invention does not intend to limit the material and shape of the heat sink.

In the present embodiment, as an example, the power components 3 may comprise a magnetic element 31. The magnetic element comprises a magnetic core 311 and a winding board 312. A lower surface of the magnetic core 311 and the lower surface of the printed circuit board 2 are in a same plane, and the lower surface of the magnetic core 311 is engaged with the upper surface of the heat sink 1. The insulating layer 5 is disposed between the lower surface of the magnetic core 311 and the upper surface of the heat sink 1. In an embodiment, the printed circuit board 2 is provided with mounting grooves 22 for guaranteeing the engagement between the lower surface of the magnetic core 311 and the upper surface of the heat sink 1. Specifically, the magnetic core 311 is mounted on the winding board 312 and positioned in the mounting grooves 22, making the lower surface of the magnetic core 311 and the lower surface of the printed circuit board 2 be in a same plane, and the winding board 312 is mounted on the printed circuit board 2 via a support member 8. In an embodiment, the support member 8 is made from a thermally and electrically conductive material. In an embodiment, the magnetic element 31 can comprise a magnetic core 311 and a winding coil, and the printed circuit board 2 is provided with mounting grooves 22 for guaranteeing the engagement between the lower surface of the magnetic core 311 and the upper surface of the heat sink 1. Specifically, the magnetic core 311 is disposed in the mounting grooves 22, with the lower surface of the magnetic core 311 and the lower surface of the printed circuit board 2 being in a same plane, and the winding coil is winded around the magnetic core 311.

In the present invention, since the lower surface of the magnetic core 311 and the lower surface of the printed circuit board 2 are in a same plane, the magnetic core 311 can thermally contact the heat sink 1 without the need of filling additional heat dissipating glue, reducing the thermal resistance between the magnetic element 31 and the heat sink.

In the present embodiment, at least one through holes 21 are formed in the printed circuit board 2 at the positions where the support member 8 is connected to the printed circuit board. The through holes 21 have a very small thermal resistance, so that heat from the winding board 312 can be conducted to the heat sink 1.

In an embodiment, as an example, the power components 3 may comprise a semiconductor device 34. As shown in FIG. 3, the semiconductor device 34 comprises a case 341, a pin 342, and a heat dissipating plate 343. The case 341 comprises a case top 3411 and a case bottom 3412, and the case bottom 3412 faces the printed circuit board 2. The heat dissipating plate 343 is disposed between the case bottom 3412 and the printed circuit board 2. The pin 342 of the semiconductor device 34 is connected to the printed circuit board 2. Hot sources 344 of the semiconductor device 34 are located at the case bottom 3412 which is close to the printed circuit board 2. A plurality of through holes 21 are formed in the printed circuit board 2 at the position below the semiconductor device 34, so that heat produced by the semiconductor device 34 is conducted to the heat sink 1 via the large number of through holes 21. In an embodiment, the heat dissipating plate 343 is generally made from a thermally and electrically conductive material, such as copper. The case 341 is generally made from a plastic packaging material with poor heat conduction property. Thus, in the present invention, the heat from the semiconductor device 34 is mainly conducted to the heat sink 1 via the heat dissipating plate 343 and through holes 21 which have excellent heat conducting property, thus obtaining an excellent heat dissipating performance.

In the prior art, the heat from the power semiconductor device 34 is dissipated from the case top (thermal resistance is larger than 15). In contrast, in the present invention, the heat from the power semiconductor device 34 is dissipated from the case bottom, resulting in a very small thermal resistance (<1). Moreover, the thermal resistance of the through holes 21 is also very small. In this way, the thermal resistance from the power semiconductor device 34 to the heat sink is far smaller than that in the prior art. The following table shows comparisons between thermal resistance of a switching device (e.g., an IGBT) packaged by Power pak so-8 (PPAK-SO8, 5 mm*6 mm) which is produced by Infineon and that of the present invention.

| thermal resistance, R | the prior art (° C./W) | the present invention (° C./W) |
| --- | --- | --- |
| from hot sources to case | 15 | 0.5 |
| through holes | N/A | 0.3 |
| heat-conducting glue | 5.6 | N/A |
| insulating layer | 10.7 | 10.7 |
| total thermal resistance | 31.3 | 11.5 |

Figure 4:
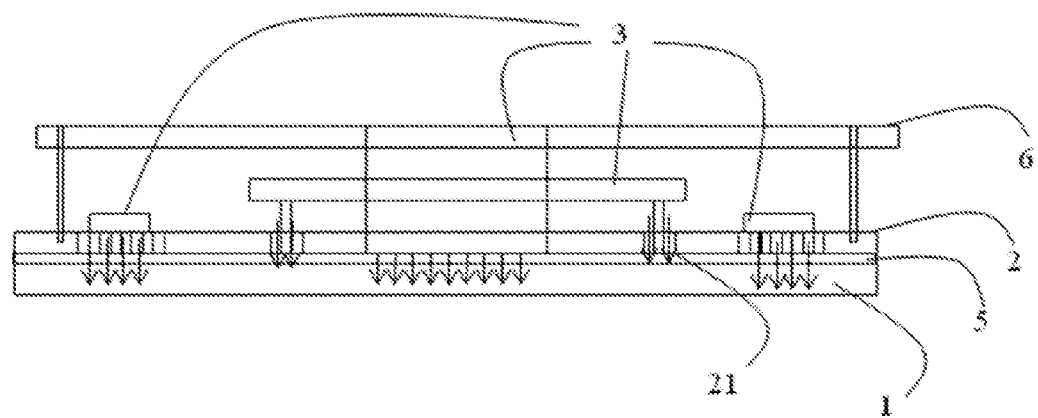
FIG. 4 is a structural view for a modular power supply in another embodiment of the present invention.

In an embodiment as shown in FIG. 4, a stacked structure comprising two printed circuit boards can be provided. Specifically, a control printed circuit board 6 can further be provided in a modular power supply. The control printed circuit board 6 is connected to the printed circuit board 2 and is disposed at a side opposite to the heat sink 1. The components and elements which do not produce heat or produce little heat can be disposed on the control printed circuit board 6, thus reducing the size of the printed circuit board 2.

The present invention further discloses a method for manufacturing the above-mentioned modular power supply, which comprises the following steps.

Step S100, mounting the power components 3 on the printed circuit board 2 by using a planar carrier 7 as a baffle during the assembling to make the lower surface of the magnetic core 311 in the power components 3 and the lower surface of the printed circuit board 2 be in a same plane.

Step S200, disposing the insulating layer 5 capable of dissipating heat on the lower surface of the printed circuit board 2 or the upper surface of the heat sink 1, so that the heat from the printed circuit board 2 can be directly conducted to the heat sink 1.

Step S300, fixing the printed circuit board 2 to the heat sink 1 to make the lower surface of the printed circuit board 2 be engaged with the upper surface of the heat sink 1, with the insulating layer 5 being disposed between the upper surface of the heat sink 1 and the lower surface of the printed circuit board 2. Since the power components 3 are not disposed on the surface of the printed circuit board 2 which contacts the heat sink 1, in one embodiment, the heat from the power components 3 is conducted to the heat sink 1 via the large number of through holes 21.

In the modular power supply of the present embodiment, the following three methods can be used to ensure that the lower surface of the magnetic core 311 and the lower surface of the printed circuit board 2 are in a same plane. An arrow is used to indicate the assembling direction of the magnetic core.

In a first method, the magnetic element 31 comprises a magnetic core 311 and a winding board 312, and Step S100 further comprises:

Step S101, connecting the winding board 312 to the printed circuit board 2;

Step S102, assembling the magnetic core 311 in the mounting grooves 22 of the printed circuit board 2 by using the planar carrier 7 as a baffle to make the lower surface of the magnetic core 311 and the lower surface of the printed circuit board 2 be in a same plane, making the lower surface of the magnetic core 311 be engaged with the upper surface of the heat sink 1, and thus minimizing thermal resistance between the magnetic element 31 and the heat sink 1.

Figure 5A:
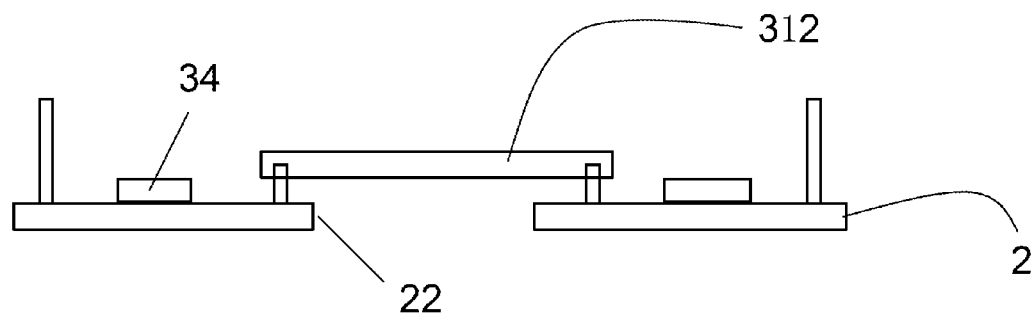
FIGS. 5A and 5B are views illustrating a first process for manufacturing a modular power supply in an embodiment of the present invention.
Figure 5B:
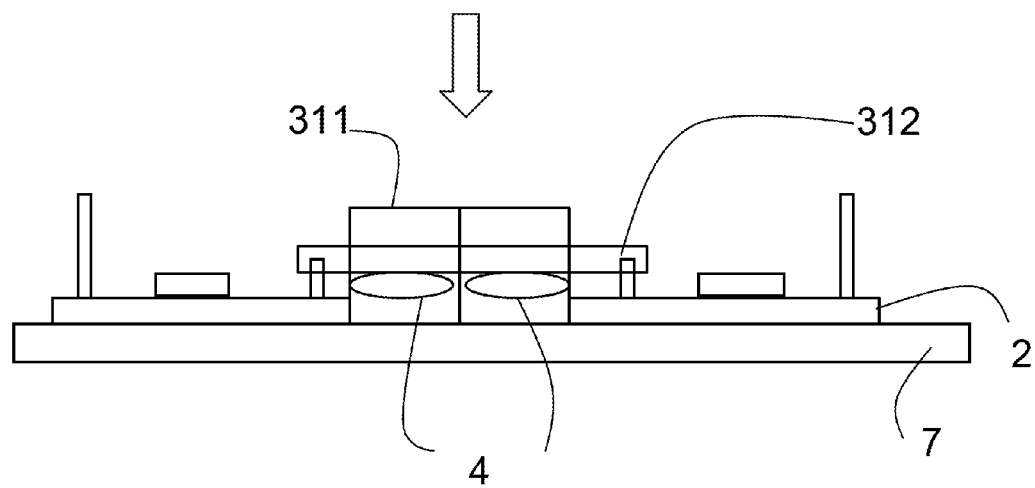

Reference is made to FIGS. 5A-5B, which illustrate a process for manufacturing a modular power supply in an embodiment of the present invention. First, the winding board 312 or framework of the magnetic element 31 is connected to the printed circuit board 2 first (FIG. 5A). Then, the magnetic core 311 and the winding board 312 or framework are assembled into the mounting grooves 22 by using the planar carrier 7 as a baffle to make the lower surface of the magnetic core 311 and the lower surface of the printed circuit board 2 be in a same plane. Heat-conducting glue 4 is used to at least partially fill a space between the magnetic core 311 and the winding board 312. As a result, heat from the winding board 312 is conducted to the magnetic core 311 via the heat-conducting glue 4, and then to the heat sink 1 via the magnetic core 311, facilitating heat dissipation of the winding board 312. In addition, since magnetic cores 311 from batch production suffer from a certain tolerance, the heat-conducting glue 4 can at least partially eliminate the tolerance among magnetic cores 311. In this way, it can be ensure that the assembled magnetic element 31 and printed circuit board 2 are in a same plane (FIG. 5B).

In a second method, the magnetic element 31 comprises a magnetic core 311 and a winding board 312, and Step S100 further comprises:

Step S101, assembling the magnetic core 311 and the winding board 312 into one piece;

Step S102, assembling the magnetic core 311 in the mounting grooves 22 of the printed circuit board 2 by using the planar carrier 7 as a baffle to make the lower surface of the magnetic core 311 and the lower surface of the printed circuit board 2 be in a same plane, making the lower surface of the magnetic core 311 be engaged with the upper surface of the heat sink 1, and thus minimizing thermal resistance between the magnetic element 31 and the heat sink 1;

Step S103, connecting the winding board 312 to the printed circuit board 2 by using the support member 8.

Figure 6A:
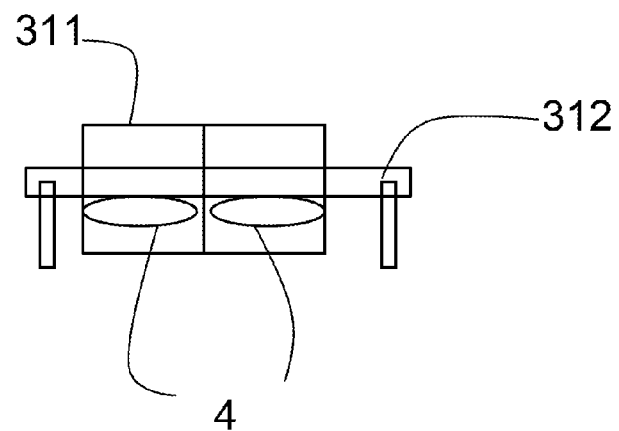
FIGS. 6A and 6B are views illustrating a second process for manufacturing a modular power supply in an embodiment of the present invention.
Figure 6B:
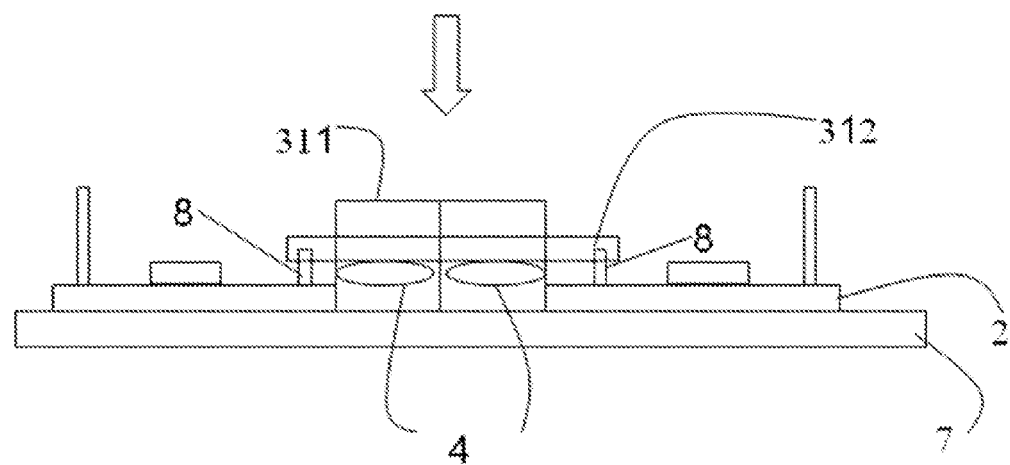

Reference is made to FIGS. 6A-6B, which illustrate another process for manufacturing a modular power supply in an embodiment of the present invention. First, the magnetic core 311 and the winding board 312 or framework are assembled into one piece (FIG. 6A). Then, the magnetic core 311 and the winding board 312 or framework is assembled into the mounting grooves 22 by using the planar carrier 7 as a baffle. The winding board 312 and the printed circuit board 2 are connected by using the support member 8, and then are soldered by e.g., reflow soldering or manual soldering (FIG. 6B). By using the planar carrier 7 as a baffle and by using the support member 8, it is possible to at least partially eliminate the tolerance among magnetic cores 311, so that the assembled magnetic element 31 and printed circuit board 2 are in a same plane (FIG. 6B).

In a third method, the magnetic element 31 comprises a magnetic core 311 and a winding board 312, and Step S100 further comprises:

Step S101, assembling a lower portion of the magnetic core 311 to the winding board 312;

Step S102, assembling the lower portion of the magnetic core 311 into the mounting grooves 22 of the printed circuit board 2 by using the planar carrier 7 as a baffle to make the lower surface of the magnetic core 311 and the lower surface of the printed circuit board 2 be in a same plane, making the lower surface of the magnetic core 311 be engaged with the upper surface of the heat sink 1, and thus minimizing thermal resistance between the magnetic element 31 and the heat sink 1;

Step S103, connecting the winding board 312 to the printed circuit board 2;

Step S104, assembling an upper portion of the magnetic core 311 to the lower portion of the magnetic core 311.

Figure 7A:
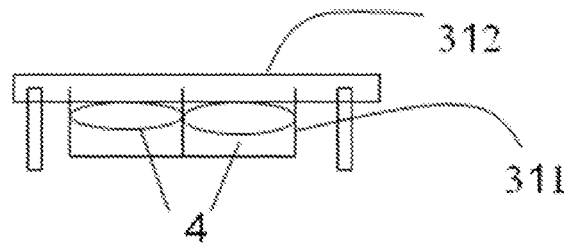
FIGS. 7A, 7B, and 7C are views illustrating a third process for manufacturing a modular power supply in an embodiment of the present invention.
Figure 7B:
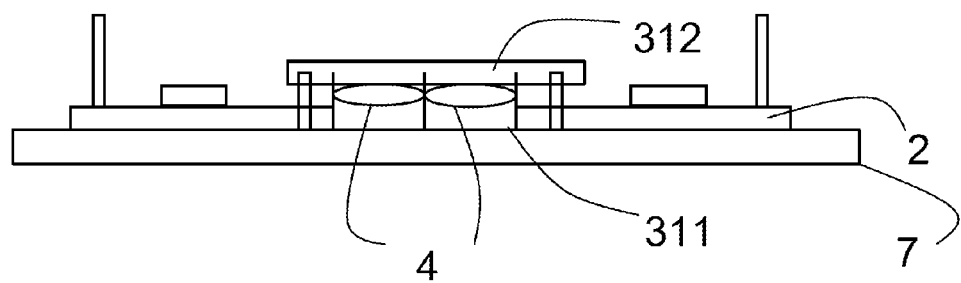
Figure 7C:
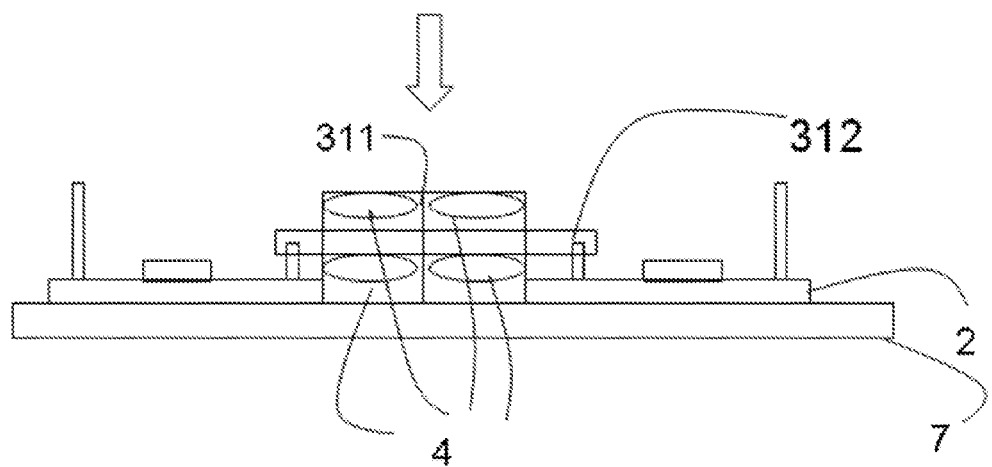

Reference is made to FIGS. 7A-7C, which illustrate a third process for manufacturing a modular power supply in an embodiment of the present invention. First, a lower portion of the magnetic core 311 and the winding board 312 or framework is assembled (FIG. 7A). Then, the lower portion of the magnetic core 311 and the winding board 312 or framework are assembled into the mounting grooves 22 by using the planar carrier 7 as a baffle to make the lower surface of the magnetic core 311 and the lower surface of the printed circuit board 2 be in a same plane, and then are soldered by e.g., reflow soldering or manual soldering (FIG. 7B). The winding board 312 is connected to the printed circuit board 2, and an upper portion of the magnetic core 311 is then assembled (FIG. 7C). In this way, with the use of the upper portion of the magnetic core 311 which is assembled at a late period, it is possible to at least partially eliminate the tolerance among magnetic cores 311, so that the assembled magnetic element 31 and printed circuit board 2 are in a same plane (FIG. 7C). Moreover, this method can solve the problem of cold welding during reflow soldering.

An embodiment of the present invention brings about one of the following advantageous effects.

1. Power components are not disposed on a surface of the printed circuit board which contacts the heat sink, and power components which require heat dissipation are disposed on the other surface of the printed circuit board, and heat of these power components are conducted to the heat sink via a large number of through holes.

2. The lower surface of the printed circuit board is planar and the upper surface of the heat sink is planar, so that the lower surface of the printed circuit board is engaged with the upper surface of the heat sink. An insulating layer is disposed between the upper surface of the heat sink and the lower surface of the printed circuit board, so that heat of the printed circuit board is directly conducted to the heat sink.

3. A grooved structure is disposed in the printed circuit board, and the magnetic element is disposed in the grooves, so that the lower surface of the magnetic element and the lower surface of the printed circuit board (i.e., a surface on which no component is disposed) lie in a same plane, and thermal resistance between the magnetic element and the heat sink is minimized.

While the invention has been described in connection with preferred embodiments, it will be understood that modifications thereof within the principles outlined above will be evident to those skilled in the art, and thus the invention is not limited to the preferred embodiments but is intended to encompass such modifications. The invention resides in each and every novel characteristic feature and each and every combination of characteristic features. Reference numerals in the claims do not limit their protective scope.

What is claimed is:

1. A modular power supply, comprising a printed circuit board, power components, and a heat sink, characterized in that, the heat sink comprises an upper surface which is planar, the power components are mounted on the printed circuit board and disposed at a side opposite to the heat sink, a lower surface of the printed circuit board is engaged with the upper surface of the heat sink, with an insulating layer being disposed between the upper surface of the heat sink and the lower surface of the printed circuit board, wherein, the power components comprise a semiconductor device, the semiconductor device comprises a case having a bottom and a top, hot sources of the semiconductor device are located at the bottom, and the bottom is close to the printed circuit board.

2. The modular power supply of claim 1, characterized in that, the power components comprise a magnetic element, the magnetic element comprises a magnetic core, a lower surface of the magnetic core and the lower surface of the printed circuit board are disposed in a same plane, the lower surface of the magnetic core is engaged with the upper surface of the heat sink, and the insulating layer is disposed between the lower surface of the magnetic core and the upper surface of the heat sink.

3. The modular power supply of claim 2, characterized in that, the printed circuit board is provided with mounting grooves which ensures that the lower surface of the magnetic core is engaged with the upper surface of the heat sink.

4. The modular power supply of claim 3, characterized in that, the magnetic element further comprises a winding board, the magnetic core is mounted on the winding board and positioned in the mounting grooves, the lower surface of the magnetic core and the lower surface of the printed circuit board are disposed in the same plane, and the winding board is mounted on the printed circuit board though a support member.

5. The modular power supply of claim 4, characterized in that, at least one heat-conducting through hole is formed on the printed circuit board at the positions where the support member is connected to the printed circuit board.

6. The modular power supply of claim 1, characterized in that, the semiconductor device further comprises a heat dissipating plate which is disposed between the bottom and the printed circuit board.

7. The modular power supply of claim 6, characterized in that, a plurality of through holes are formed in the printed circuit board at the positions below the semiconductor device.

8. The modular power supply of claim 1, characterized by further comprising a control printed circuit board which is connected to the printed circuit board and disposed at a side opposite to the heat sink.

9. The modular power supply of claim 1, characterized in that, the insulating layer is an insulating sheet which is formed integrally as one unit.

10. A method for manufacturing the modular power supply as claimed by claim 1, characterized by comprising the following steps:

S100, mounting the power components on the printed circuit board by using a planar carrier as a baffle during assembling to make the lower surface of the magnetic core in the power components and the lower surface of the printed circuit board be in a same plane;

S200, disposing the insulating layer on the lower surface of the printed circuit board or the upper surface of the heat sink, so that the heat from the printed circuit board can be directly conducted to the heat sink;

S300, fixing the printed circuit board to the heat sink to make the lower surface of the printed circuit board be engaged with the upper surface of the heat sink, with the insulating layer being disposed between the upper surface of the heat sink and the lower surface of the printed circuit board, the printed circuit board is not provided with any power component at its surface contacting the heat sink, and the heat from the power components is conducted to the heat sink via the through holes.

11. The method of claim 10, characterized in that, the power components comprise a magnetic element which comprises a magnetic core and a winding board, and step S100 further comprises:

S101, connecting the winding board to the printed circuit board;

S102, assembling the magnetic core in the mounting grooves of the printed circuit board by using the planar carrier as the baffle to make the lower surface of the magnetic core and the lower surface of the printed circuit board be in the same plane, making the lower surface of the magnetic core be engaged with the upper surface of the heat sink, and thus minimizing thermal resistance between the magnetic element and the heat sink.

12. The method of claim 10, characterized in that, the power components comprise a magnetic element which comprises a magnetic core and a winding board, and step S100 further comprises:

S101, assembling the magnetic core and the winding board into one piece;

S102, assembling the magnetic core in the mounting grooves of the printed circuit board by using the planar carrier as the baffle to make the lower surface of the magnetic core and the lower surface of the printed circuit board be in the same plane, making the lower surface of the magnetic core be engaged with the upper surface of the heat sink, and thus minimizing thermal resistance between the magnetic element and the heat sink;

S103, connecting the winding board to the printed circuit board by using the support member.

13. The method of claim 10, characterized in that, the power components comprise a magnetic element which comprises a magnetic core and a winding board, and step S100 further comprises:

S101, assembling a lower portion of the magnetic core to the winding board;

S102, assembling the lower portion of the magnetic core into the mounting grooves of the printed circuit board by using the planar carrier as the baffle to make the lower surface of the magnetic core and the lower surface of the printed circuit board be in the same plane, making the lower surface of the magnetic core be engaged with the upper surface of the heat sink, and thus minimizing thermal resistance between the magnetic element and the heat sink;

S103, connecting the winding board to the printed circuit board;

S104, assembling an upper portion of the magnetic core to the lower portion of the magnetic core.

14. The method of claim 10, characterized in that, the insulating layer is an insulating sheet which is formed integrally as one unit.

* * * * *